United States Patent
Paul et al.

(10) Patent No.: US 6,552,415 B1
(45) Date of Patent: Apr. 22, 2003

(54) ELECTRICALLY STABILIZED THIN-FILM HIGH-TEMPERATURE SUPERCONDUCTOR AND METHOD FOR THE PRODUCTION THEREOF

(75) Inventors: Willi Paul, Wettingen (CH); Makan Chen, Baden-Dattwil (CH)

(73) Assignee: ABB Research Ltd, Zurich (CH)

( * ) Notice: Subject to any disclaimer, the term of this patent is extended or adjusted under 35 U.S.C. 154(b) by 0 days.

(21) Appl. No.: 09/762,790
(22) PCT Filed: Aug. 2, 1999
(86) PCT No.: PCT/CH99/00359
§ 371 (c)(1),
(2), (4) Date: Feb. 13, 2001
(87) PCT Pub. No.: WO00/10208
PCT Pub. Date: Feb. 24, 2000

(30) Foreign Application Priority Data

Aug. 14, 1998 (DE) .......................... 198 36 860

(51) Int. Cl.$^7$ .......................... H01L 21/00; H01L 39/00
(52) U.S. Cl. .......................... 257/661; 438/754; 438/2; 505/220; 505/330; 257/662
(58) Field of Search .......................... 438/2, 384, 607, 438/754; 505/220, 330; 257/661, 662, 663

(56) References Cited

U.S. PATENT DOCUMENTS 5,593,918 A * 1/1997 Rostoker .......................... 438/2
6,165,801 A * 12/2000 Burns et al. .................... 438/2

FOREIGN PATENT DOCUMENTS

| DE | 19520205 A1 | 12/1996 |
| DE | 19634424 A1 | 3/1998 |
| EP | 0 312 015 A2 | 4/1989 |
| EP | 0 339 801 A1 | 11/1989 |
| EP | 0 488 717 A1 | 6/1992 |
| JP | 4-3477 A | 1/1992 |
| JP | 04021597 | 1/1992 |
| JP | 5-226706 A | 9/1993 |
| JP | 5-235421 A | 9/1993 |
| JP | 05251758 A | 9/1993 |
| JP | 08083932 A | 3/1996 |
| JP | 09172206 A | 6/1997 |
| WO | 96/10269 | 4/1996 |

OTHER PUBLICATIONS

K. Hasegawa, et al., "In–plane Aligned YBCO Thin Film Tape Fabricated by Pulsed Laser Deposition", Oct. 1996, pp. 745–748.
B. Gromoll, et al., "Resistive Current Limiters With YBCO Films", Jun. 1997, vol. 7, No. 2, pp. 828–831.
German Patent Office Search Report.
German Patent Office Classifiction.

* cited by examiner

Primary Examiner—Caridad Everhart
(74) Attorney, Agent, or Firm—Burns, Doane, Swecker & Mathis, L.L.P.

(57) ABSTRACT

An electrically stabilized thin-film high-temperature superconductor includes a superconductive layer (32) applied over a flat metallic substrate (31) and connected to the metallic substrate (31) so that electrical contact between the superconductive layer (32) and the metallic substrate (31) is distributed over the area of the metallic substrate (31).

7 Claims, 4 Drawing Sheets

ELECTRICALLY STABILIZED THIN-FILM HIGH-TEMPERATURE SUPERCONDUCTOR AND METHOD FOR THE PRODUCTION THEREOF

FIELD OF THE INVENTION

The present invention relates to the field of the technical application of high-temperature superconductors (HTS). It relates to an electrically stabilized thin-film high-temperature superconductor comprising a superconductive layer which is applied to a flat metallic substrate. Such a thin-film HTS is known, for example, from the article by K. Hasegawa et al., In-plane Aligned YBCO Thin Film Tape Fabricated by Pulsed Laser Deposition, International Symposium on Superconductivity (ISS 196), Sapporo, Oct. 21–24 (1996), p. 745–748.

It also relates to a method for producing such an HTS.

BACKGROUND OF THE INVENTION

To apply high-temperature superconductors (HTS) reliably at high electrical power such as, e.g. in a fault current limiter (FCL), it is essential to provide the superconductor with a reliable electrical bypass which prevents the formation of so-called hot spots which occur during the quenching of the superconductor due to production-related material inhomogeneities and can impair the function of the component. Such a bypass in the form of a layer of Au or Ag applied in the form of a flat layer applied to the HTS layer is described in the article by B. Gromoll et al., Resistive Current Limiter with YBCO Films, IEEE Transactions on Applied Superconductivity, Vol. 7, 1997, p. 828–831.

The bypass is intended to homogenize the voltage distribution by functioning as an alternative high-current path when the HTS quenches. This makes it possible to prevent the formation of hot spots. The minimum requirements for such a bypass are (1) good electrical contact to the HTS and (2) adequate thermal capacity for limiting the temperature rise.

In the printed document mentioned initially, a method has been described how a high-quality thin film of great length of Y-123 (YBCO) can be applied to a typical metallic substrate (e.g. of hastelloy) by means of pulsed laser deposition (PLD). However, a buffer layer of, e.g. yttrium-stabilized zirconium dioxide (YSZ) is provided between the substrate and the HTS in this case in order to prevent the oxidation of the substrate and the chemical reaction between the two layers. There is, therefore, no electrical contact between the HTS and the underlying substrate which, in principle, would be quite suitable as an electrical bypass.

SUMMARY OF THE INVENTION

It is, therefore, the object of the invention to create an electrically stabilized thin film high temperature superconductor in which the supporting substrate is used as an electrical bypass, and to specify a method for producing it.

In an HTS of the type initially mentioned, the object is achieved in that the superconductive layer is in electrical contact with the substrate in a manner so as to be distributed over the area of the substrate via a flat conductive layer applied to the surface of the superconductive layer opposing the substrate. Due to the contact between the HTS layer and the underlying metallic substrate being distributed over the area, many bypass paths for the current are created distributed over the area which can prevent the formation of hot spots at any point of the element at any time.

A first preferred embodiment is distinguished by the fact that contacting openings are arranged distributed over the area in the superconductive layer and in the underlying buffer layer, which openings expose the underlying substrate, that the conductive layer is conducted in a contacting manner to the exposed substrate in the area of the contacting openings, and that the contacting openings are generated by removing the superconductive layer or, respectively, the buffer layer. The number and distribution of the contacting openings can be optimized by means of conventional mask etching methods in such a manner that hot spots are reliably prevented by the substrate acting as bypass without unnecessarily reducing the cross section available for transporting the current.

A second preferred embodiment is characterized in that the contacting openings are generated by covering or shadowing during the application of the superconductive layer or, respectively, the buffer layer. In this case, additional masking and etching steps can be dispensed with during the generation of the contacting openings.

A first preferred embodiment of the method according to the invention is based on the fact that an electrically insulating buffer layer is applied to the full area of the metallic substrate in a first step, that the superconductive layer is applied to the full area of the electrically conductive buffer layer in a second step, that contacting openings are generated in the two applied layers at various points of the area in a third step, preferably by means of a mask etching method, through which contacting openings the substrate is freely accessible from above, and that a conductive layer which is in contact with the area of the superconductive layer and connects it to the exposed substrate through the contacting openings is applied to the full area in a fourth step.

A second embodiment of the method according to the invention is characterized in that an electrically insulating buffer layer is applied to the area of the substrate by means of a directed application from a first direction in a first step, the first direction being selected in such a manner that the bottoms of the grooves remain partially uncovered due to shadowing and form contacting openings, that the superconductive layer is applied to the electrically insulating buffer layer by means of a directed application from the first direction in a second step, and that a conductive layer, which contacts the area of the superconductive layer and connects it to the exposed substrate through the contacting openings on the bottoms of the grooves, is applied to the full area in a third step.

BRIEF DESCRIPTION OF THE DRAWINGS

In the text which follows, the invention will be explained in greater detail with reference to exemplary embodiments and in connection with the drawing, in which.

DETAILED DESCRIPTION OF THE INVENTION

It is particularly advantageous if the proven buffer layers for preventing reactions between the superconductive layer and its substrate, such as, e.g. the non-conductive YSZ mentioned initially could be used without having to dispense with the advantages of the substrate used as a bypass. Two examples of such a solution are reproduced in FIGS. 1A–F and 2A–D, the individual part-figures in each case designating certain steps in their production.

Figure 1A:
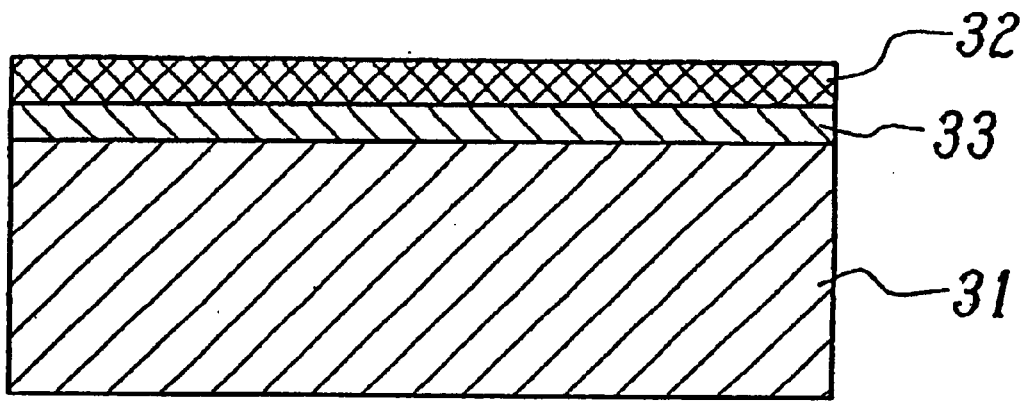
FIGS. 1A–F show various steps in the production of a thin-film HTS according to a first preferred exemplary embodiment of the invention, in which the contacting between HTS layer and substrate occurs via local contacting openings opened by means of removal.
Figure 1B:
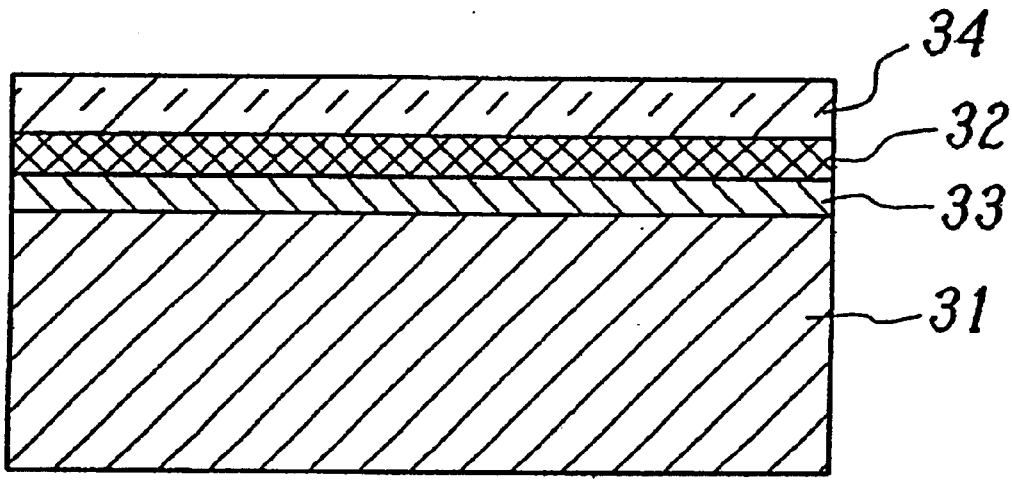
Figure 1C:
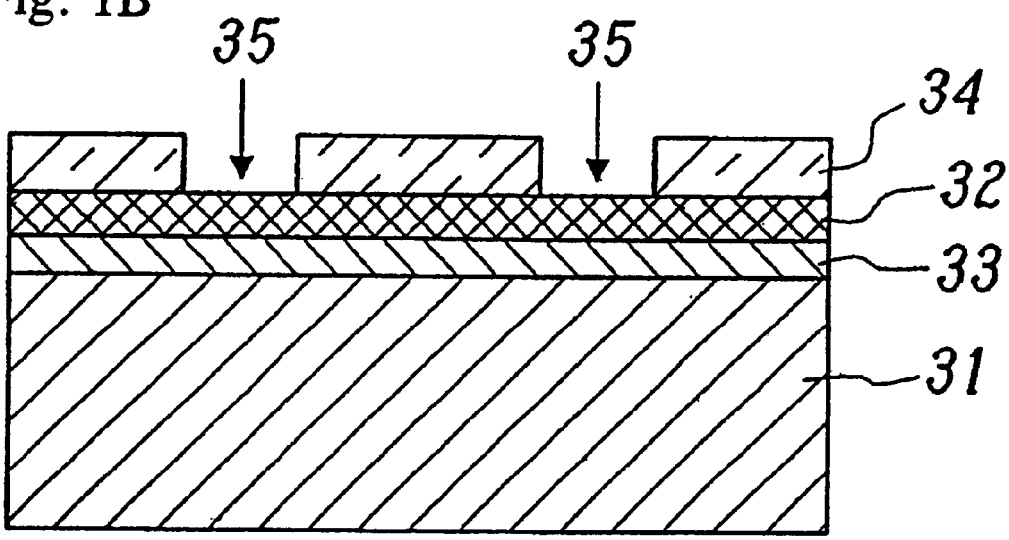

The preferred exemplary embodiment of FIG. 1 is based on a metallic substrate 31 to the surface of which, in succession, a buffer layer 33 (e.g. of YSZ or CeO or $Y_2O_3$) and the actual superconductive layer 32 (e.g. of YBCO) are applied with the known methods described in the printed documents mentioned initially (FIG. 1A). Onto this sequence of layers, a mask layer 34 of a suitable photoresist or the like is subsequently applied (FIG. 1B) and subsequently patterned by opening mask openings 35 in the mask layer 34 uniformly distributed over the area (FIG. 1C).

Figure 1D:
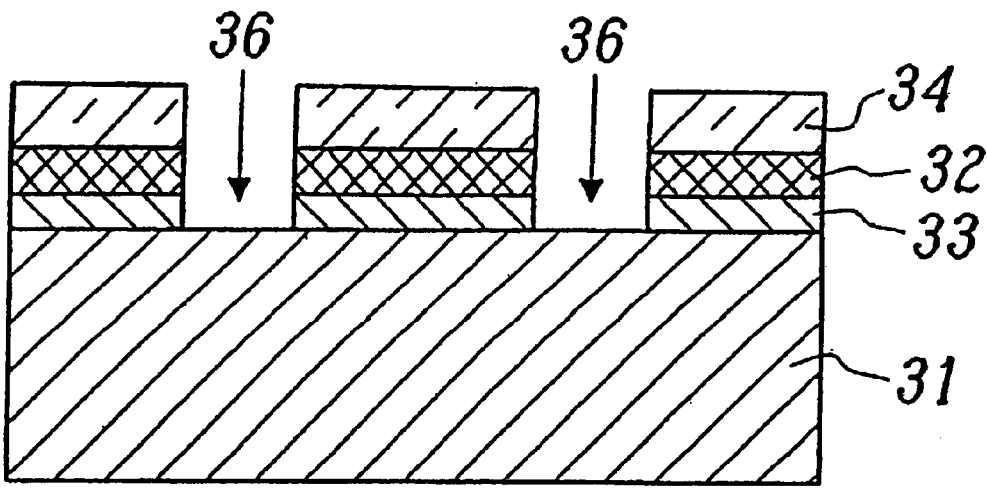
Figure 1E:
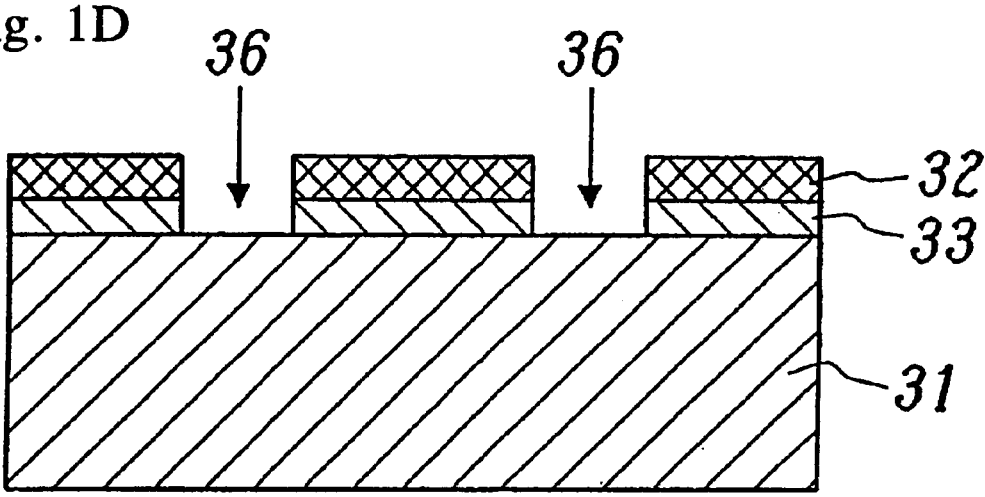
Figure 1F:
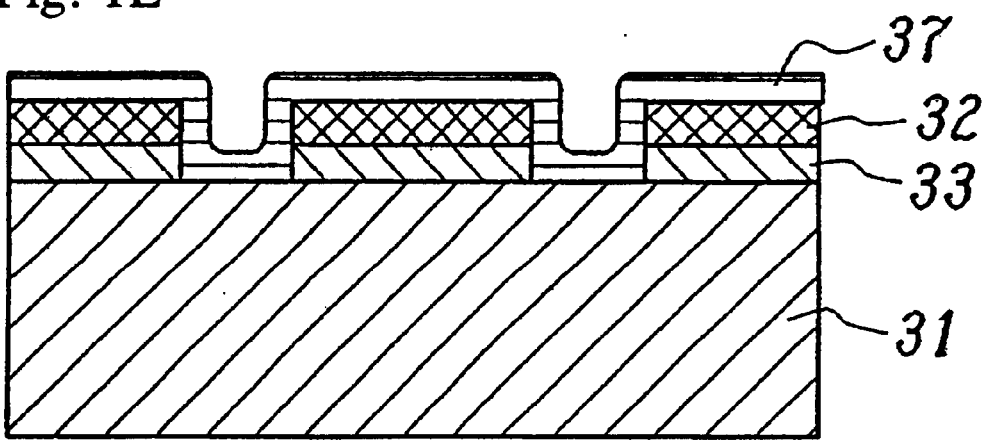

Through these mask openings 35, the two underlying layers 32 (superconductive layer) and 33 (buffer layer) are subsequently removed by means of a conventional material removal method such as, e.g. sputter etching, thus producing contacting openings 36 through which the surface of the substrate 31 is freely accessible (FIG. 1D). After the mask layer 34 has been removed (FIG. 1E), a conductive layer (e.g. of Ag or Au) is subsequently applied to the whole area for completing the thin film high temperature superconductor 30 (FIG. 1F), which conductive layer contacts the whole area of the superconductive layer 32 outside the contacting openings 36 and connects it electrically conductively to the substrate 31 within the contacting openings 37. Naturally, the size of the contacting openings 36 must be selected in such a manner that adequate contacting of the substrate 31 is possible. On the other hand, the number and distribution of the contacting openings 36 must be selected in such a manner that an adequate bypass function by the point-contacted substrate 31 is ensured for each area of the superconductive layer 32.

A point-contacted substrate is also used in the exemplary embodiment according to FIG. 2. The basis for this is a metallic substrate 41 in which indentations in the form of grooves 45 having preferably perpendicular side walls are arranged uniformly distributed over the area to be coated (FIG. 2A). Onto the surface of the substrate 41 to be coated, an electrically insulating buffer layer 43 is then applied to the area by directed application from a first direction (arrows in FIG. 2A) in a first step. The first direction is selected in such a manner that the bottoms of the grooves 45 remain partially uncovered due to shadowing by the side walls, and form contacting openings 46 (FIG. 2A).

Figure 2A:
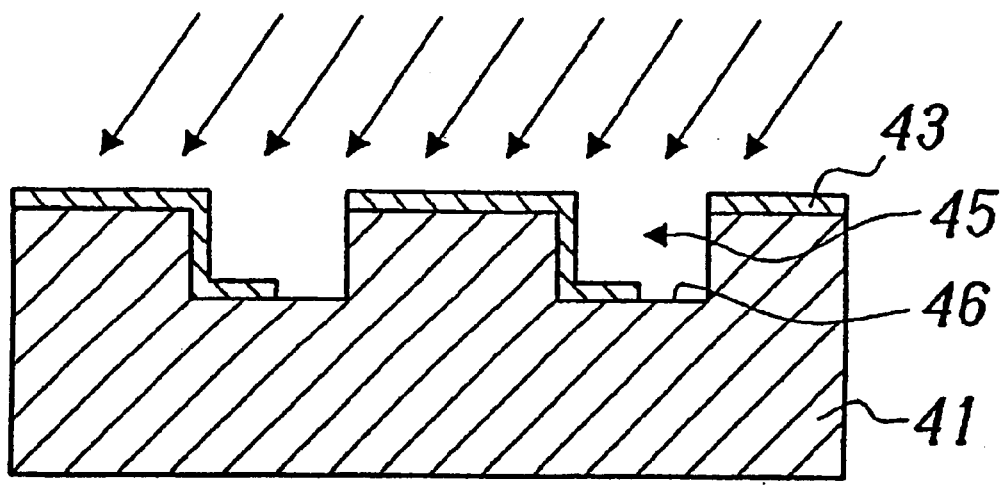
FIGS. 2A–D show various steps in the production of a thin-film HTS according to a second preferred exemplary embodiment of the invention, in which the contacting between HTS layer and substrate occurs via local contacting openings left open by means of uncovering or shadowing.
Figure 2B:
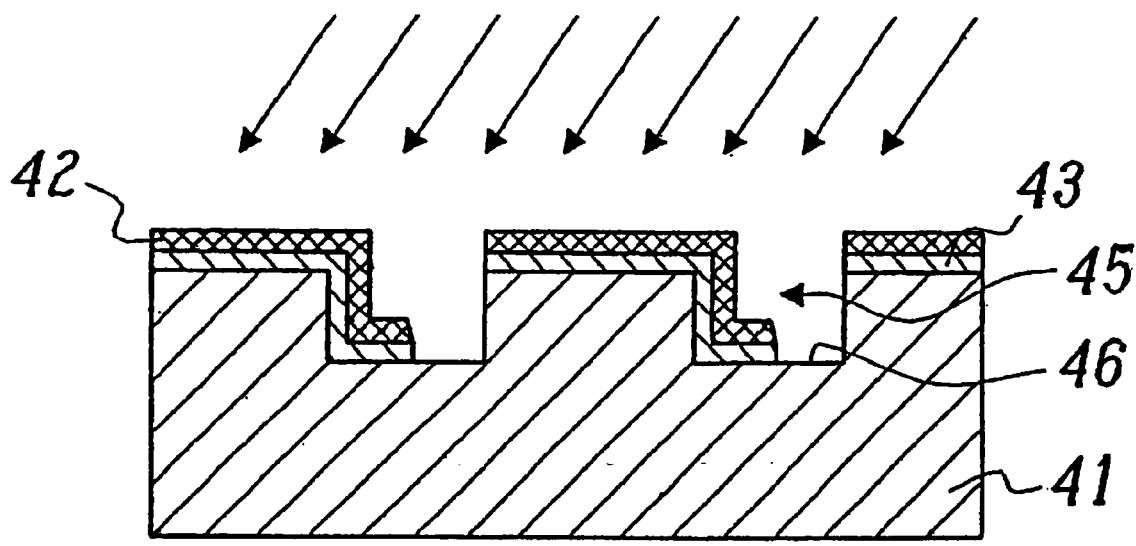
Figure 2C:
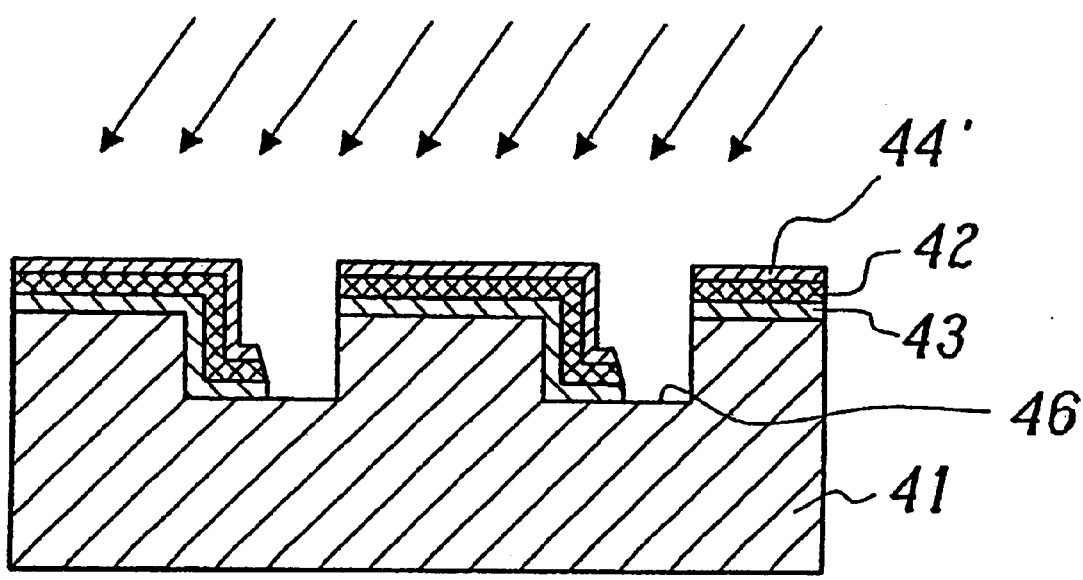
Figure 2D:
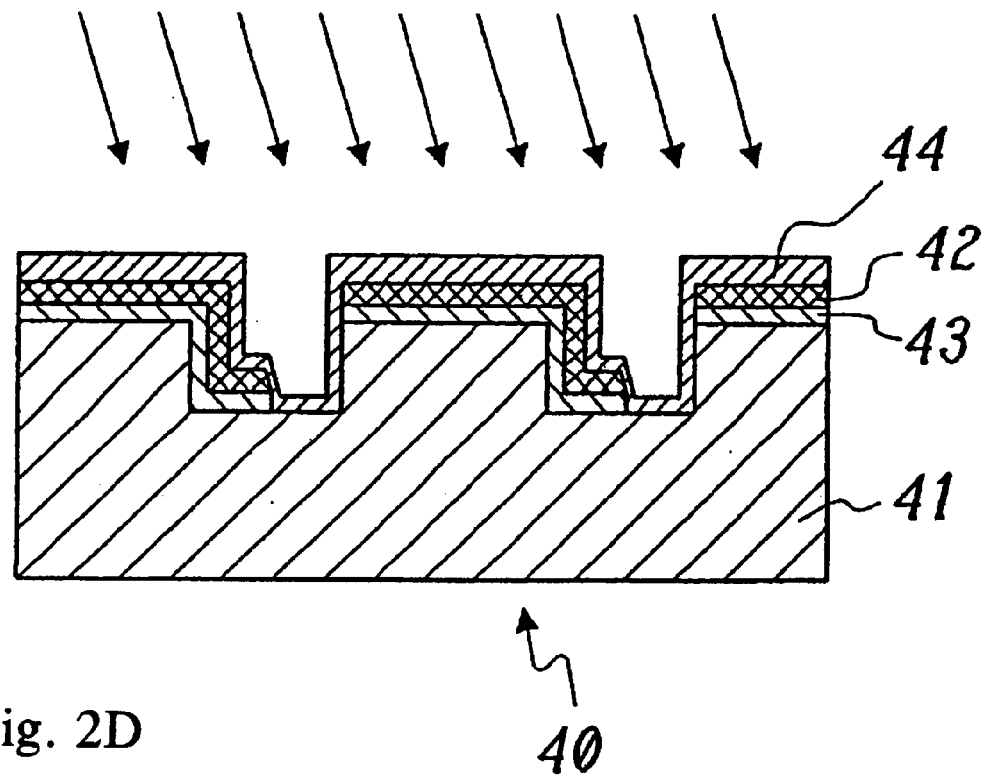

In a second step (FIG. 2B), a superconductive layer 42 is applied to the electrically insulating buffer layer 43 by directed application from the first direction. Due to the same shadowing effect, the contacting openings 46 also remain free in this application process. In a third step, a conductive layer 44 is then applied to the complete area, which layer is in contact with the area of the superconductive layer 42 and connects it electrically conductively to the substrate 41 which is exposed there, through the contacting openings 46 on the bottoms of the grooves 45. Within the third step, a first conductive layer 44 possibly is then preferably applied by directed application from the first direction in a first part-step, which conductive layer covers the superconductive layer 42 and essentially leaves the contacting opening 46 exposed (FIG. 2C). In a second part-step (FIG. 2D), the first conductive layer 44' is then reinforced to become the finished conductive layer 44 by directed application from a second direction which differs from the first one, and is at the same time conductively connected to the substrate 41 through the contacting openings 46 which results in the thin-film high-temperature.

In the arrangements according to FIG. 1 and FIG. 2, the current thus flows perpendicularly to the plane of the section through the high temperature superconductor shown.

Overall, the invention produces an electrically stabilized thin-film high-temperature superconductor which makes use of the metallic substrate for electrical stabilization and allows the most varied materials to be selected for the substrate.

LIST OF REFERENCE DESIGNATIONS

30,40 Thin-film HTS (electrically stabilized)
31,41 Metallic substrate
32,42 SL layer
33,43 Buffer layer
34 Mask layer
35 Mask opening
36,46 Contacting opening
37,44,44' Conductive layer
45 Groove

What is claimed is:

1. An electrically stabilized thin-film high-temperature superconductor comprising a superconductive layer which is applied to a flat metallic substrate, and an insulating buffer layer arranged between the superconductive layer and the substrate, wherein, on a side of the superconductive layer opposite the buffer layer, a flat conductive layer, which is in electrical contact with the superconductive layer is applied, and that the conductive layer is electrically conductively connected to the substrate at a number of points distributed over the area.

2. The thin-film high-temperature superconductor as claimed in claim 1, wherein, in the superconductive layer and possibly in the underlying buffer layer contacting openings are arranged distributed over the area, which openings expose the underlying substrate, and that the conductive layer is conducted in a contacting manner to the exposed substrate in the area of the contacting openings.

3. The thin-film high-temperature superconductor as claimed in claim 1, wherein the superconductive layer consists of a ceramic high-temperature superconductor, especially YBCO, and that the buffer layer consists of yttrium-stabilized zirconium dioxide or CeO or $Y_2O_3$.

4. A method for producing an electrically stabilized thin-film high-temperature superconductor, comprising:
   applying an electrically insulating buffer layer to a full area of a metallic substrate;
   applying a superconductive layer to a full area of the electrically insulating buffer layer;
   generating contacting openings in the two applied layers at various points of the full area; and
   applying a conductive layer to the full area, the conductive layer contacting the superconductive layer and connecting it to the metallic substrate through the contacting openings.

5. The method of claim 4, wherein the contacting openings are generated via a mask etching method.

6. A method for producing an electrically stabilized thin-film high-temperature superconductor, comprising:

applying an electrically insulating buffer layer to an area of a metallic substrate which is provided with grooves arranged distributed over the area, via a directed application from a first direction;

selecting the first direction in such a manner that the bottoms of the grooves remain partially uncovered due to shadowing and form contact openings;

applying a superconductive layer to the electrically insulating buffer layer via a directed application from the first direction; and applying a conductive layer, the conductive layer contacting an area of the superconductive layer and connecting the superconductive layer to the metallic substrate through the contacting openings on the bottoms of the grooves.

7. The method as claimed in claim 6, wherein, within the third step, a first conductive layer which covers the superconductive layer and essentially leaves the contacting openings exposed is applied by directed application from the first direction in a first part-step, and that the first conductive layer is reinforced and, at the same time, connected to the substrate through the contacting openings by directed application from a second direction which differs from the first direction, in a second part-step.

* * * * *